United States Patent [19]

Schwabe et al.

[11] Patent Number: 4,459,740

[45] Date of Patent: Jul. 17, 1984

[54] METHOD FOR MANUFACTURING VLSI COMPLEMENTARY MOS FIELD EFFECT TRANSISTOR CIRCUITS IN SILICON GATE TECHNOLOGY

[75] Inventors: Ulrich Schwabe, Munich; Erwin Jacobs, Vaterstetten; Adolf Scheibe, Ottobrunn, all of Fed. Rep. of Germany

[73] Assignee: Siemens Aktiengesellschaft, Berlin & Munich, Fed. Rep. of Germany

[21] Appl. No.: 406,717

[22] Filed: Aug. 9, 1982

[30] Foreign Application Priority Data

Aug. 25, 1981 [DE] Fed. Rep. of Germany ....... 3133468

[51] Int. Cl.$^3$ .................... H01L 21/22; H01L 29/78; H01L 21/265
[52] U.S. Cl. .................... 29/576 B; 29/571; 148/1.5; 148/187; 357/42; 357/91
[58] Field of Search .............. 29/576 B, 571; 148/1.5, 148/187; 357/42, 91

[56] References Cited

U.S. PATENT DOCUMENTS

| | | | |
|---|---|---|---|
| 4,033,797 | 7/1977 | Dill et al. | 148/187 |
| 4,217,149 | 8/1980 | Sawazaki | 148/1.5 |
| 4,268,321 | 5/1981 | Meguro | 148/1.5 |
| 4,280,272 | 7/1981 | Egawa et al. | 29/571 |
| 4,306,916 | 12/1981 | Wollesen et al. | 148/1.5 |
| 4,325,169 | 4/1982 | Ponder et al. | 29/571 |
| 4,382,827 | 5/1983 | Moran et al. | 148/1.5 |
| 4,385,947 | 5/1983 | Halfacre et al. | 148/187 |
| 4,391,650 | 7/1983 | Pfeifer et al. | 148/1.5 |

OTHER PUBLICATIONS

T. Ohzone et al., "Silicon-Gate n-Well CMOS Process by Full Ion-Implantation Technology", *IEEE Transactions on Election Devices*, vol. ED-27, (1980), pp. 1789-1795.

L. C. Parrillo et al., "Twin-Tub CMOS-A Technology for VLSI Circuits", *IEDM Technical Digest*, (1980), Paper 29.1, pp. 752-755.

*Primary Examiner*—Upendra Roy
*Attorney, Agent, or Firm*—Hill, Van Santen, Steadman & Simpson

[57] ABSTRACT

Complementary MOS field effect transistor circuits are produced in silicon gate technology, with the method steps up to the structuring of the gate electrode being executed in a known manner. Both source/drain implantations (FIG. 3, 8 and FIG. 5, 10) occur with only one mask (7a). This mask (7a), which is composed of silicon nitride, is utilized for the source/drain implantation 8 of the n-channel transistors (9). The source/drain implantation (10) for the p-channel transistors (11) occurs without a mask and the oxide layer thickness, $d_6$, over the source/drain regions of the n-channel transistors (9) functions as a masking layer. An advantage of this process sequence is that switched capacitor structures (FIG. 6, 5b, 12) can be simultaneously produced whereby the oxide layer thickness, $d_4$, over the polysilicon-1 level (5a, 5b) determines the thickness of the insulating layer, $d_{cox}$, of the capacitor structures (5b, 12). This technique is useful for manufacturing VLSI CMOS circuits in VLSI technology with and without switched capacitors.

11 Claims, 6 Drawing Figures

METHOD FOR MANUFACTURING VLSI COMPLEMENTARY MOS FIELD EFFECT TRANSISTOR CIRCUITS IN SILICON GATE TECHNOLOGY

BACKGROUND OF THE INVENTION

1. Field of the Invention

The present invention relates to manufacture of highly integrated complementary MOS field effect transistor circuits in silicon gate technology and somewhat more particularly to a method of manufacturing such circuits with switched capacitance of double polysilicon structures contained in the circuits.

2. Prior Art

Workers in the art are aware of processes for manufacturing highly integrated complementary MOS field effect transistor circuits (CMOS-FET's) wherein different technologies, which are very involved, are utilized for source/drain implantation of n-channel and p-channel transistors. In such processes, steps are known for the definition of troughts or tubs, for the acceptance of the n- or p- channel transistors, for the field and channel implantations for active MOS regions of the circuit, as well as for the generation of field oxide regions, for formation of the gate oxide and the deposition and structuring of the polysilicon -1 level for formation of the gate regions and capacitance structures.

In one prior art technique, T. Ohzone et al, "Silicon-Gate n-Well CMOS Process by Full Ion-Implantation Technology", *IEEE Transactions On Electron Devices*, Vol. ED-27, (1980) pages 1789–1795, suggest the use of separate, i.e., two, masks for the S/D n+ implantation of the n-channel transistors and for the S/D p+ implantation of the p-channel transistors of the circuit. This is disadvantageous in that the CMOS fabrication process, which is already critical per se with respect to yield, is further burdened by an additional mask.

In another prior art technique, L. C. Parillo et al, "Twin Tub CMOS-A Technology For VLSI-Circuits", *IEDM Technical Digest,* (1980), Paper 29.1, pages 752–755 suggests a method which works with only one mask in the source/drain implantation and instead overcompensates the diffusion region of a given conductivity type with a more highly doped ion implantation of the other conductivity type by means of two different ion implantations. A disadvantage of this technique is that no flat source/drain regions (vertical penetration depth $xj < 0.5$ um) can be attained.

It is further required in known methods of this type that the manufacture of capacitance structures in a double polysilicon, gate CMOS process requires an additional mask for etching the dielectric, this again resulting in a reduction of yield for the process.

SUMMARY OF THE INVENTION

The invention provides a technique for executing a CMOS process in which as few process steps as possible are utilized for manufacturing desired circuits and in which, however, it is nonetheless guaranteed that the manner of functioning of the components of the circuit is not negatively influenced. Moreover, the process sequence of the invention allows co-formation of switched capacitance structures in silicon-2-gate technology during the process for manufacturing the circuit consisting of n- and p- channel transistors without great outlay, i.e., without additional masking steps.

In accordance with the principles of the invention, only a single mask for both source/drain implantations is utilized and double implantation in one diffusion region is avoided.

In accordance with the principles of the invention, a method of the type earlier described is improved by a sequence of the following steps:

(a) thermally oxidizing the entire surface to such a degree that an oxide layer thickness, $d_4$, over polysilicon structures corresponds to a desired thickness of the insulation layer for the capacitance structures, whereby the oxide layer thickness, $d_3$, over the source/drain regions is determined at the same time; such regions not being masked during an ion implantation for formation of source/drain regions of the p-channel transistors, carried out later:

(b) depositing a surface-wide silicon nitride layer masking the source/drain regions of the p-channel transistors in a layer thickness matched to the implantation energy level utilized in the subsequent source/drain implantation:

(c) etching the silicon nitride layer in such a manner that the regions of the p-channel transistor as well as the polysilicon structures provided for capacitances remain covered by the silicon nitride layer:

(d) implanting ions non-selectively so as to form the source/drain regions of the n-channel transistors:

(e) thermally oxidizing the entire surface to such a degree that the oxide layer thickness, $d_6$, over the surface/drain region of the n-channel transistor suffices as a masking layer:

(f) removing the nitride layer structures:

(g) implanting ions non-selectively so as to form the source/drain regions of the p-channel transistors;

(h) depositing and etching the polysilicon-2 level for forming capacitance structures; and (i) forming an insulation layer, contact hole regions and metal interconnect structure level in a known manner.

With the thermal oxidation step (a) above, the oxide layer laying naked over the substrate, on the one hand, is oxidized up to a scatter oxide and, on the other hand, the capacitance oxide required for the insulating layer grows on the polysilicon regions in a desired thickness which has a masking effect for both source/drain implantations (n-channel and p-channel transistors) and which results in a "pull-back" effect at the polysilicon edges. With this "pull-back", the edge of the implantation zone is drawn back from the polysilicon, however, the self-adjusting property of polysilicon is retained for the source/drain implantation. With the foregoing, lateral out-diffusion of the source/drain regions, a defined, small under-diffusion of the gate regions occurs and provides a significant reduction of Miller capacitances (parasitic capacitances of the gate/source and gate/drain regions). An increase of the switching speed results therefrom. The magnitude determining the duration for oxidation is the desired thickness of the capacitance oxide ($d_4 = d_{cox}$) because it is essential that the thermal oxidation step (a) above, can be utilized for the formation of the insulating layer of the capacitance structures, (switched capacitors) which form the resistors of the RC network in filter modules for TELCOM applications. Thus, a further masking step which is necessary in prior art process sequences, is eliminated.

However, by following the principles of the invention one can also design the process sequence in such a manner that complementary field effect transistor circuits without additional switched capacitors can be produced. To achieve this, method step (h) above, is simply eliminated; the determination of the oxide layer thickness according to step (a) ensues according to the oxide layer thickness, $d_3$, and the etching of the silicon nitride layer in step (c) occurs in such a manner that only the regions of the p-channel transistors remain covered by the silicon nitride layer.

In certain embodiments of the invention, the polysilicon-2 level is replaced with a level composed of silicides of metals having a relatively high melting point, a preferred one of which is $TaSi_2$.

In certain embodiments of the invention, the oxide layer thickness, $d_4$, is attained during an oxidation time period sufficient to achieve a thickness in a range of about 50 through 200 nm. In certain embodiments of the invention, the silicon nitride layer thickness, $d_5$, is controlled so as range from about 50 through 150 nm.

In certain embodiments of the invention, the oxide layer thickness, $d_6$, is attained during an oxidation time period sufficient to achieve a thickness in a range of about 100 through 300 nm. Further, in embodiments of the invention where a polysilicon-2 level is utilized, the polysilicon layer thickness is regulated so as to range from about 200 through 500 nm and in embodiments where a silicide layer, $d_8{}^*$, is utilized, the silicide layer thickness is regulated so as to range from about 200 through 300 nm.

In certain embodiments of the invention, the dose and energy levels utilized in the source/drain implantation of the n-channel transistors with arsenic is regulated so as to range, respectively, from about $1 \cdot 10^{15}$ through $1 \cdot 10^{16}$ cm$^{-2}$ and from about 80 through 100 keV. Similarly, in certain embodiments of the invention, the dose and energy levels utilized in the source/drain implantation of the p-channel transistors with boron is regulated so as to range, respectively, from about $1 \cdot 10^{15}$ through $1 \cdot 10^{16}$ cm$^{-2}$ and from about 20 through 25 keV.

DESCRIPTION OF PREFERRED EMBODIMENTS

Figure 1:
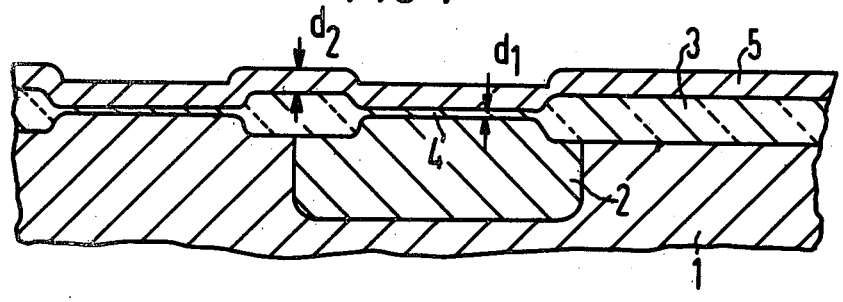
FIGS. 1-6 are partial, elevated, cross-sectional schematic views of a circuit undergoing manufacturing in accordance with the principles of the invention and illustrates structures attained by the method steps essential to the invention.
Figure 2:
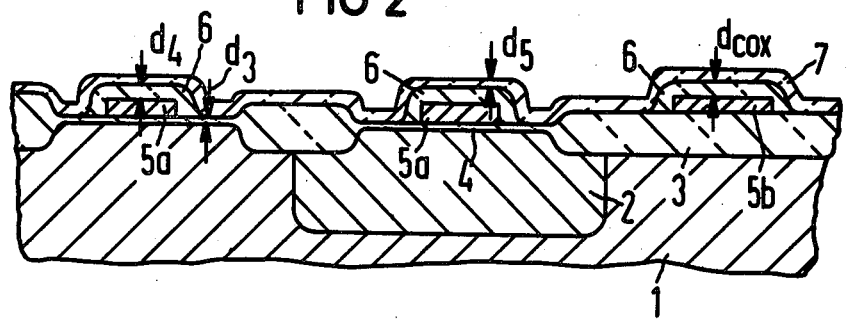
Figure 3:
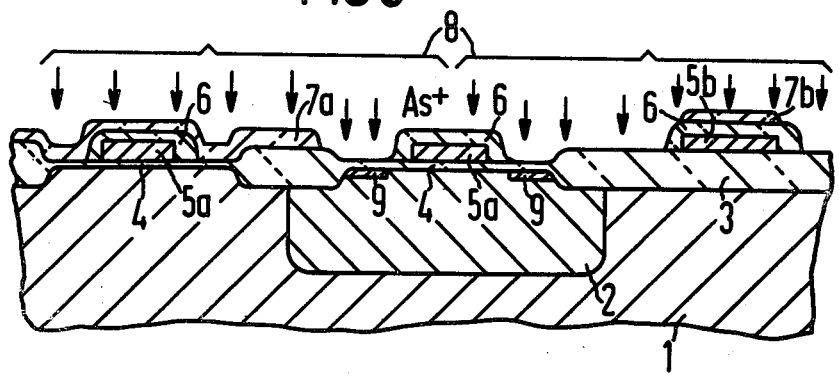

In the drawings, identical reference numerals are utilized to identify the same parts throughout the various Figures.

The invention will be further described in an exemplary embodiment wherein a process sequence for source/drain implantation of p- and n- channel transistors occurs and the production of capacitances within a CMOS process for manufacture of integrated semiconductor circuits in VLSI technology is described.

FIG. 1

Traditional methods of CMOS process technology can be applied up to the process step of structuring a polysilicon-1 level 5. Therefore, for purposes of greater clarity, the structures produced by means of known process steps have not been illustrated, except for the p-tub 2 required in a n-doped silicon substrate 1 for the n-channel transistors, and except for the field oxide 3, and for the gate oxide 4. FIG. 1 shows the arrangement in which a polysilicon layer 5 with a layer thickness, $d_2$, of about 500 nm has been deposited onto a gate oxide 4, which in the exemplary embodiment here under discussion, has a layer thickness, $d_1$, of about 40 nm.

FIG. 2

After etching of the polysilicon-1 level 5 for formation of the gate regions 5a and the capacitance structures 5b (first or lower electrode), the entire surface is thermally oxidized, whereby on the one hand, an exposed 40 nm thick oxide layer, $d_1$, is further oxidized up to an approximately 50 nm thick scatter oxide, $d_3$, and, on the other hand, an approximately 100 nm ($=d_4$) thick oxide 6 grows on the polysilicon regions 5a and 5b, and produces a masking effect for both source/drain implantations (n- and p- channel transistors) and results in a "pull back" effect at the polysilicon edges (5a). The variable determining the duration of oxidation is, therefore, the desired thickness, $d_4$, or, respectively, $d_{cox}$, of the oxide layer 6 situated on the polysilicon regions 5a and 5b. This oxide layer 6, as well as the oxide layer 4 reinforced by the scatter oxide, form the base for a silicon nitride layer 7, now to be applied. The thickness of the silicon nitride layer 7, $d_5$, is selected in such a manner that it guarantees masking against an arsenic implantation used for generating the n-channel transistors in the p-tub 2. In an exemplary embodiment, the nitride layer thickness, $d_5$, is about 100 nm.

FIG. 3

The now-etched silicon nitride layer 7a is employed as a mask for the arsenic ion implantation, schematically indicated at 8, which now occurs, whereby dose values ranging between about $3 \cdot 10^{15}$ to $1 \cdot 10^{16}$ cm$^2$ and energy levels ranging between about 80 to 100 keV are utilized. The source/drain regions 9 of the n-channel transistors are thus formed and are driven-in during a subsequent oxidation.

FIG. 4

Figure 4:
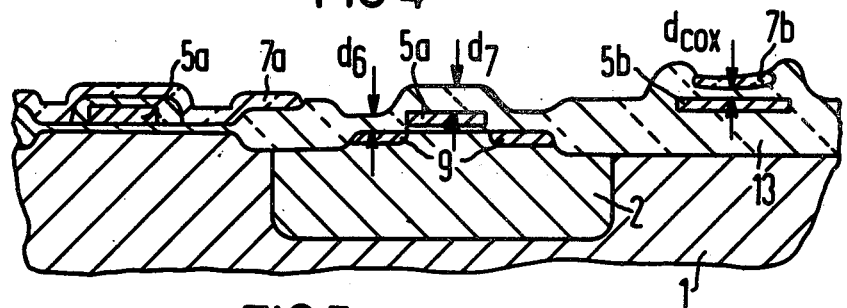
Figure 5:
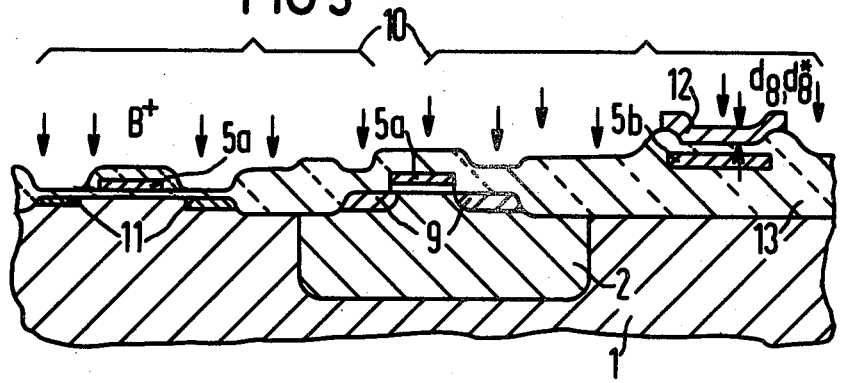

During the thermal oxidation carried out after the above arsenic implantation 8, the oxide structures in the n$^+$ regions 9 are oxidized up to a thickness, $d_6$, which guarantees a sufficient masking during a boron implantation utilized for forming the p-channel transistors, which is yet to follow. In the exemplary embodiment under discussion, the thickness, $d_6$, amounts to about 200 nm (this thickness, before the oxidation was $d_3$) and the thickness $d_7$ over the gate of the n-channel transistor amounts to about 400 nm (this thickness before the oxidation was $d_4$). This oxidation step is practically a second LOCOS step (because the nitride layers 7a is still present). The capacitance oxide, $d_{cox}$, which is $d_4$, remains substantially uninfluenced because of the nitride masking 7b. For the sake of simplicity, the oxide layers situated on the entire substrate in FIG. 4 and in the subsequent figures, is now referenced with reference numeral 13.

FIG. 5

After removal of the nitride structures 7a and 7b, a boron ion implantation, schematically indicated by reference numeral 10, for generating the p-channel transistors occurs surface-wide without a mask. Thereby, dose levels ranging between about $2 \cdot 10^{15}$ to $4 \cdot 10^{15}$ cm$^{-2}$ and energy levels ranging between about 20 and 25 keV are utilized. After the implanted doping material atoms have been driven in, the source/drain regions 11 of the p-channel transistors arise.

With a double polysilicon-2 process, the deposition of a polysilicon-2 layer in a layer thickness, $d_8$, of about 500 nm or, for example, of a tantalum silicide layer in a layer thickness, $d_8^*$, of about 200 through 300 nm now occurs. After etching the polysilicon-2 or silicide layer form, on the one hand, the upper electrode 12 of the capacitance structures (further electrode 5b) and, on the other hand, such layer can be utilized as a second interconnect level (not illustrated in the FIGURE).

FIG. 6

All further processes, such as application of an insulating oxide 14, introduction of contact holes, manufacture of a metallization level 15 (for example, composed of aluminum/silicon or aluminum/silicon/titanium) and passivation of the circuit occurs in a known manner.

Figure 6:
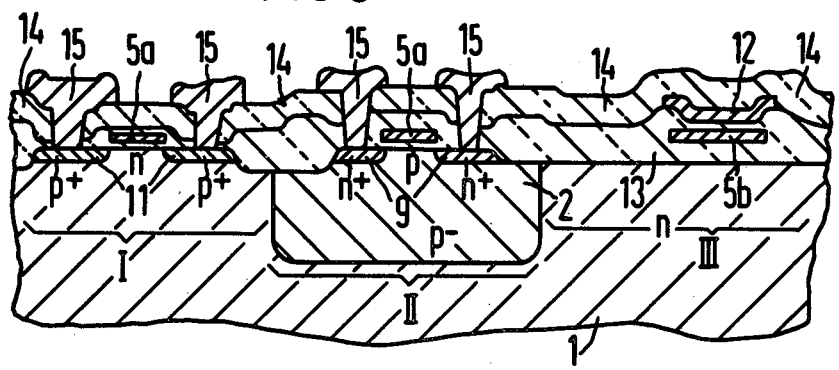

In FIG. 6, regions of the p-channel transistor are referenced by reference symbol I, regions of the n-channel transistor are referenced with reference symbol II and the capacitance regions of the circuit is referenced with reference symbol III.

As is apparent from the foregoing specification, the present invention is susceptible of being embodied with various alterations and modifications which may differ particularly from those that have been described in the preceding specification and description. For this reason, it is to be fully understood that all the foregoing is intended to be merely illustrative it is not to be construed or interpreted as being restrictive or otherwise limiting of the present invention, accepting as it is set forth and defined in the hereto-appended claims.

We claim as our invention:

1. In a method for producing VLSI complementary MOS field effect transistor circuits in silicon gate technology, particularly with switched capacitors of double polysilicon structures contained in such circuits, in which the process steps for defining the tub for acceptance of the n- or, respectively, the p-channel transistors, for forming the field and channel implantations for active MOS regions of said circuits, as well as for the forming of field oxide regions and the gate oxide and the deposition and etching of the polysilicon-1 level for formation of gate regions and capacitance structures occur in a known manner, wherein the improvement comprises a sequence of the following steps:
   (a) thermally oxidizing the entire surface to such a degree that an oxide layer thickness, $d_4$, over the polysilicon structures (5a, 5b) corresponds to a desired thickness of an insulating layer for the capacitance structures, whereby at the same time, the oxide layer thickness, $d_3$, over the source/drain regions (11) is determined, such regions not being masked in an ion implantation (10) occuring later for forming the source/drain regions of the p-channel transistors (11);
   (b) depositing a surface-wide silicon nitride layer (7) masking the source/drain regions (11) of the p-channel transistors in a layer thickness matched to the implantation energy level utilized in a subsequent source/drain implantation (8);
   (c) etching the silicon nitride layer (7a, 7b) in such a manner that regions of the p-channel transistors (11) as well as the polysilicon structures (5b) provided for capacitances remained covered by the etched silicon nitride layer;
   (d) implanting ions non-selectively for forming the source/drain regions (9) of the n-channel transistors;
   (e) thermally oxidizing the entire surface to such a degree that the oxide layer thickness, $d_6$, over the surface/drain regions of the n-channel transistors is sufficient as a masking layer for a subsequent implantation (10) utilized for generating the source/drain regions (11) of the p-channel transistors;
   (f) removing the nitride layer structures (7a, 7b);
   (g) implanting ions non-selectively for forming the source/drain regions (11) of the p-channel transistors;
   (h) depositing and etching a polysilicon-2 level (12) for the capacitance structures; and
   (i) forming an insulating layer (14), contact hole regions and metal interconnect level (15) in a known manner.

2. In a method for producing VLSI complementary MOS field effect transistor circuits in silicon gate technology without additional switched capacitors structures, in which the process steps for defining the tubs for acceptance of the n- or, respectively, the p- channel transistors, for forming the field and channel implantations for active MOS regions of said circuits, as well as for forming of field oxide regions and the gate oxide and the deposition and etching of the polysilicon-1 level for formation of gate regions and capacitance structures occur in a known manner, whereby the improvement comprises a sequence of the following steps:
   (a) thermally oxidizing the entire surface to such a degree that an oxide layer thickness, $d_3$, over the source/drain regions (11) is defined, such regions not being masked during an ion implantation (10) for formation of source/drain regions of the p-channel transistors (11), carried out later;
   (b) depositing a surface-wide silicon nitride layer (7) masking the source/drain regions (11) of the p-channel transistors in a layer thickness matched to the implantation energy level utilized in a subsequent source/drain implantation (8);
   (c) etching the silicon nitride layer (7a) in such a manner that only regions (11) of the p-channel transistors remain covered by the silicon nitride layer;
   (d) implanting ions non-selectively (8) for forming the source/drain regions (9) of the n-channel transistors;
   (e) thermally oxidizing the entire surface to such a degree that the oxide layer thickness, $d_6$, over the surface/drain regions of the n-channel transistors is sufficient as a masking layer for a subsequent implantation (10) utilized for forming the source/drain regions (11) of the p-channel transistors;
   (f) removing the nitride layer structures (7a);
   (g) implanting ions non-selectively (10) for forming the source/drain regions (11) of the p-channel transistors;
   (h) forming an isulating layer (14), contact hole regions and metal interconnect level (15) in a known manner.

3. In a method as defined in claim 1, wherein during step (h) a level consisting of a silicide of metals having a relatively high melting point, is utilized instead of the polysilicon-2 level (12).

4. In a method as defined in claim 3, wherein said silicide is $TaSi_2$.

5. In a method as defined in claim 1, wherein the oxide layer thickness, $d_4$, is attained during an oxidation time period sufficient to achieve a thickness in a range of about 50 through 200 nm.

6. In a method as defined in claim 1, wherein the silicon nitride layer thickness, $d_5$, is controlled so as to range from about 50 through 150 nm.

7. In a method as defined in claim 1, wherein the oxide layer thickness, $d_6$, is attained during an oxidation time period sufficient to achieve a thickness in a range of about 100 through 300 nm.

8. In a method as defined in claim 1, wherein the dose and energy levels utilized in the source/drain implantation of the n-channel transistors with arsenic is regulated so as to range, respectively, from about $1 \cdot 10^{15}$ through $1 \cdot 10^{16}$ cm$^{-2}$ and from about 80 through 100 keV.

9. In a method as defined in claim 1, wherein the dose and energy levels utilized in the source/drain implantation of the p-channel transistors with boron is regulated so as to range, respectively, from about $1 \cdot 10^{15}$ through $1 \cdot 10^{16}$ cm$^{-2}$ and from about 20 through 25 keV.

10. In a method as defined in claim 1, wherein the layer thickness of the polysilicon-2 layer, $d_8$, is controlled so as to range from about 200 through 500 nm.

11. In a method as defined in claim 2, wherein the layer thickness of the silicide level, $d_8^*$, is controlled so as to range from about 200 through 300 nm.

* * * * *